United States Patent
Chao

[11] Patent Number: 5,909,045
[45] Date of Patent: Jun. 1, 1999

[54] SEMICONDUCTOR MEMORY DEVICE HAVING TREE-TYPE CAPACITOR

[75] Inventor: Fang-Ching Chao, Hsinchu, Taiwan

[73] Assignee: United Microelectronics Corporation, Taiwan

[21] Appl. No.: 08/736,924

[22] Filed: Oct. 25, 1996

[30] Foreign Application Priority Data

Aug. 16, 1996 [TW] Taiwan .................................. 85110001

[51] Int. Cl.⁶ ................................................ H01L 27/108
[52] U.S. Cl. ........................... 257/308; 257/306; 257/307
[58] Field of Search .......................... 257/296, 306–309; 438/396, 397, 399

[56] References Cited

U.S. PATENT DOCUMENTS

| | | | |
|---|---|---|---|
| 4,974,040 | 11/1990 | Taguchi et al. ......................... | 257/309 |
| 5,071,783 | 12/1991 | Taguchi et al. . | |
| 5,077,688 | 12/1991 | Kumanoya et al. . | |
| 5,089,869 | 2/1992 | Matsuo et al. . | |
| 5,102,820 | 4/1992 | Chiba . | |
| 5,126,810 | 6/1992 | Gotou . | |
| 5,142,639 | 8/1992 | Kohyama et al. . | |
| 5,155,657 | 10/1992 | Oehrlein et al. . | |
| 5,158,905 | 10/1992 | Ahn . | |
| 5,164,337 | 11/1992 | Ogawa et al. . | |
| 5,172,201 | 12/1992 | Suizu . | |
| 5,196,365 | 3/1993 | Gotou . | |
| 5,206,787 | 4/1993 | Fujioka . | |
| 5,266,512 | 11/1993 | Kirsch . | |
| 5,274,258 | 12/1993 | Ahn . | |
| 5,338,955 | 8/1994 | Tamura et al. ......................... | 257/308 |
| 5,354,704 | 10/1994 | Yang et al. . | |
| 5,371,701 | 12/1994 | Lee et al. . | |
| 5,389,568 | 2/1995 | Yun . | |
| 5,399,518 | 3/1995 | Sim et al. . | |
| 5,438,011 | 8/1995 | Blalock et al. . | |
| 5,443,993 | 8/1995 | Park et al. . | |
| 5,453,633 | 9/1995 | Yun . | |
| 5,478,770 | 12/1995 | Kim . | |
| 5,508,222 | 4/1996 | Sakae . | |
| 5,521,419 | 5/1996 | Wakamiya et al. . | |
| 5,523,542 | 6/1996 | Chen et al. . | |
| 5,550,080 | 8/1996 | Kim . | |
| 5,561,309 | 10/1996 | Cho et al. . | |
| 5,561,310 | 10/1996 | Woo et al. . | |
| 5,572,053 | 11/1996 | Ema . | |
| 5,595,931 | 1/1997 | Kim . | |
| 5,696,395 | 12/1997 | Tseng ...................................... | 257/308 |

FOREIGN PATENT DOCUMENTS

| | | |
|---|---|---|
| 5-21745 | 1/1993 | Japan . |
| 5-251657 | 9/1993 | Japan . |
| 6-151748 | 5/1994 | Japan . |
| 2 252 447 | 8/1992 | United Kingdom . |

OTHER PUBLICATIONS

Ema et al., "3–Dimensional Stacked Capacitor Cell for 16M and 64M DRAMS", International Electron Devices Meeting, pp. 592–595, Dec. 1988.

Wakamiya et al., "Novel Stacked Capacitor Cell for 64–Mb DRAM", 1989 Symposium on VLSI Technology Digest of Technical Papers, pp. 69–70.

*Primary Examiner*—Sara Crane
*Attorney, Agent, or Firm*—Rabin & Champagne, P.C.

[57] ABSTRACT

A semiconductor memory device such as a DRAM device with a tree-type capacitor having an increased charge storage area includes a substrate, a transfer transistor formed on the substrate and having a drain region, and the tree-type capacitor electrically connected to the drain region. The tree-type capacitor includes a storage electrode shaped in a tree-structure having a trunk-like conductive layer and at least a branch-like conductive layer branching out from the trunk-like conductive layer. A dielectric layer covers the storage electrode and an overlaying conductive layer covers the dielectric layer. The trunk-like conductive layer has one end electrically connected to the drain region of the transfer transistor. The trunk-like conductive layer and the branch-like conductive layer in combination form the storage electrode of the data storage capacitor of the semiconductor memory device and the overlaying conductive layer serves as an opposed electrode to the storage electrode.

25 Claims, 14 Drawing Sheets

SEMICONDUCTOR MEMORY DEVICE HAVING TREE-TYPE CAPACITOR

BACKGROUND OF THE INVENTION

1. Field of the Invention

This invention relates to semiconductor memory devices, and more particularly to a semiconductor memory device such as a DRAM (dynamic random access memory) device which uses memory cells each composed of a transfer transistor and a tree-type capacitor for data storage.

2. Description of the Related Art

FIG. 1 shows a schematic circuit diagram of a single memory cell of a DRAM device, which includes a transfer transistor T and a data storage capacitor C that can retain thereon electric charge representative of data. The transfer transistor T includes a source connected to a corresponding bit line BL, a drain connected to a storage electrode 6 of the data storage capacitor C, and a gate connected to a corresponding word line WL. Further, the data storage capacitor C has an opposed electrode 8 connected to a constant power source and a dielectric film 7 formed between the storage electrode 6 and the opposed electrode 8.

In conventional DRAMs having a storage, capacity less than 1 Mbit (megabit), it is a customary practice to use a two-dimensional capacitor called a planar-type capacitor as the data storage capacitor. However, a drawback of the planar-type capacitor is that its structure takes up quite a large surface area in order to store an adequate amount of charge to reliably represent data. The planar-type capacitor is therefore not suitable for DRAM devices having a high degree of integration. In large scale integration DRAMs, such as DRAMs with 4M or higher, a three-dimensional capacitor, e.g., a stacked-type or a trench-type capacitor, is used as the data storage capacitor.

The stacked-type or the trench-type capacitor allows a large amount of electric charge representative of data to be stored thereon, even if the feature size of the DRAM device is downsized for large scale integration. However, for VLSI (very-large-scale integration) DRAMs such as 64M DRAMs, the stacked-type and trench-type capacitors can no longer provide adequate charge storage areas for the data storage capacitors for reliable data retaining capability.

One solution to the foregoing problem is to utilize the so-called fin-type stacked capacitor. Such capacitors, are described, for example, in a paper entitled "3-*Dimensional Stacked Capacitor Cell for* 16*M and* 64*M DRAMs*" by Ema et al. in *International Electron Devices Meeting*, pp. 592–595, December 1988. The fin-type stacked capacitor is composed of electrodes and dielectric films that are formed into a fin-like structure having a plurality of stacked layers that allow an increased surface area for the storage electrodes. Various patents have issued which relate to the fin-type stacked capacitor, including U.S. Pat. Nos. 5,071,783; 5,126,810; 5,196,365; and 5,206,787.

Another solution is to utilize the so-called cylindrical-type stacked capacitor. This type of capacitor is described, for example, in a paper entitled "*Novel Stacked Capacitor Cell for* 64-*Mb DRAM*", by Wakamiya et al. on 1989 *Symposium on VLSI Technology Digest of Technical Papers*, pp. 69–70. The cylindrical-type stacked capacitor is composed of electrodes and dielectric films that are formed into an upright extended cylindrical shape which can increase the surface area of the storage electrodes. Various patents have been issued which relate to the cylindrical-type stacked capacitor, including U.S. Pat. No. 5,077,688.

With the trend toward larger and larger scale integration, the feature size of a single DRAM cell is correspondingly reduced. However, this also causes a reduction in the surface area, and thus the capacitance, of the data storage capacitor. A small capacitance for the data storage capacitor would make the DRAM device more likely to incur soft errors, for example, due to the incidence of α-rays. Therefore, there still exists a need in the semiconductor industry for a new and improved stricture for the data storage capacitors of DRAM devices, that can nonetheless allow the data storage capacitors to have an adequate capacitance for reliable data storage when the DRAM cells are downsized for higher integration.

SUMMARY OF THE INVENTION

It is therefore an object of the invention to provide a semiconductor memory device which includes a tree-type capacitor for data storage, the tree-type capacitor having a storage electrode with an increased surface area, so as to provide an increased capacitance, for more reliable data retention.

In accordance with a preferred embodiment of the invention, the semiconductor memory device includes a substrate, a transfer transistor formed on the substrate and having source/drain regions, and a tree-type capacitor electrically connected to one of the source/drain regions of the transfer transistor. The tree-type capacitor includes a trunk-like conductive layer having a bottom end electrically coupled to the one of the source/drain regions, the trunk-like conductive layer having an upright portion extending substantially upwardly from the bottom end. The capacitor also includes at least a first branch-like conductive layer substantially L-shaped in cross section, wherein the first branch-like conductive layer has one end electrically connected to a surface of the trunk-like conductive layer, and wherein the trunk-like conductive layer and the first branch-like conductive layer in combination form a storage electrode for the capacitor. A dielectric layer is formed over exposed surfaces of both the trunk-like conductive layer and the first branch-like conductive layer. An overlaying conductive layer overlays the dielectric layer, and serves as an opposed electrode of the capacitor.

In accordance with another embodiment of the invention, the trunk-like conductive layer is an integral element having one end electrically connected to one of the source/drain regions. The trunk-like conductive layer can be substantially T-shaped in cross section, or be a substantially pillar-shaped solid element.

In accordance with still another embodiment, the trunk-like conductive layer includes a bottom trunk-like portion and a top trunk-like portion. The bottom trunk-like portion has a top end and a bottom end, the bottom end being electrically connected to the one of the source/drain regions. The top trunk-like portion extends substantially upwardly from the top end of the bottom trunk-like portion. The bottom trunk-like portion is substantially T-shaped in cross section, and the top trunk-like portion can be either substantially T-shaped in cross section or be a substantially pillar-shaped solid element.

In accordance with yet another embodiment of the invention, the semiconductor memory device includes a substrate, a transfer transistor having source/drain regions on the substrate, and a tree-type capacitor electrically connected to one of the source/drain regions. The tree-type capacitor includes a trunk-like conductive layer having a bottom end electrically coupled to the one of the source/ drain regions, wherein the trunk-like conductive layer has an upright portion extending substantially upwardly from the bottom end. The capacitor also includes at least a first branch-like conductive layer having a first segment and a second segment, wherein a first end of the first segment is connected to an outer surface of the trunk-like conductive layer and extends substantially horizontally therefrom (outwardly parallel to the surface of the substrate), and a second segment has one end connected to a second end of the first segment and extends substantially downward (toward the surface of the substrate) therefrom. The trunk-like conductive layer and the first branch-like conductive layer in combination constitute a storage electrode for the capacitor. A dielectric layer is formed over exposed surfaces of both the trunk-like conductive layer and the first branch-like conductive layer. A conductive layer overlays the dielectric layer, the overlaying conductive layer serving as an opposed electrode of the tree-type capacitor.

In accordance with still yet another embodiment of the invention, the first branch-like conductive layer has a first segment and a second segment. The first segment has a first end connected to an outer surface of the trunk-like conductive layer, and the second segment extends out from a second end of the first segment on one side of the trunk-like conductive layer.

BRIEF DESCRIPTION OF DRAWINGS

The invention can be more fully understood from the following detailed description of the preferred embodiments, with reference to the accompanying drawings, wherein.

DETAILED DESCRIPTION OF THE PREFERRED EMBODIMENTS

First Embodiment

FIGS. 2A through 2I are sectional diagrams depicting the steps involved in a method for fabricating a first preferred embodiment of the semiconductor memory device according to the invention.

Figure 1:
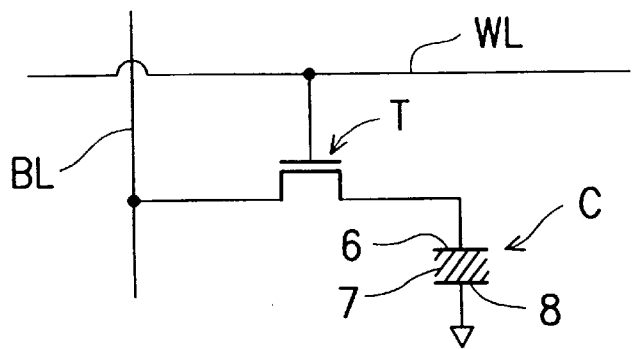
FIG. 1 is a schematic circuit diagram of a single memory cell of a DRAM device.
Figure 2A:
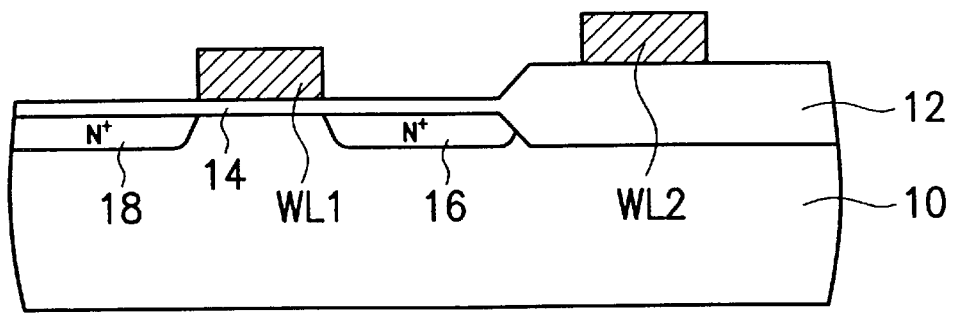
FIGS. 2A through 2I are sectional views depicting, the steps involved in a method for fabricating a semiconductor memory device according to a first embodiment of the invention.

Referring first to FIG. 2A, a silicon substrate 10 is subjected to thermal oxidation by the LOCOS (local oxidation of silicon) method to form a field oxidation film 12 having a thickness of, for example, about 3,000 Å (angstrom, over the silicon substrate 10. Subsequently, the silicon substrate 10 is again subjected to thermal oxidation to form a gate oxidation layer 14 having a thickness of about 150 Å, for example. After that, a polysilicon layer is deposited over the entire top surface of the silicon substrate 10 by chemical vapor deposition (CVD) or low pressure chemical vapor deposition (LPCVD), to a thickness, for example, of about 2,000 Å. Suitable impurities such as phosphorus ions can be diffused into the polysilicon layer to increase its conductivity. In addition, a refractory metal layer, for example, can be deposited over the polysilicon layer and then annealed to turn the polysilicon layer into polycide, to further increase the conductivity of the polysilicon layer. The refractory metal layer can be, for example, a layer of tungsten (W) deposited, for example, to a thickness of about 2,000 Å. A conventional photolithographic and etching process is then performed on the wafer to define and form over the wafer, polysilicon metallization layers, called word lines WL1 and WL2, which serve as gates, as illustrated in FIG. 2A. Subsequently, a drain region 16 and a source region 18 are formed in the silicon substrate 10, for example, by implantation of arsenic ions into selected regions on the silicon substrate 10. During this process, the word lines WL1 and WL2 serve as a mask for the implantation, and the arsenic ions are implanted, for example, with an energy of 70 KeV and a concentration of about $1 \times 10^{15}$ atoms/cm$^2$.

Figure 2B:
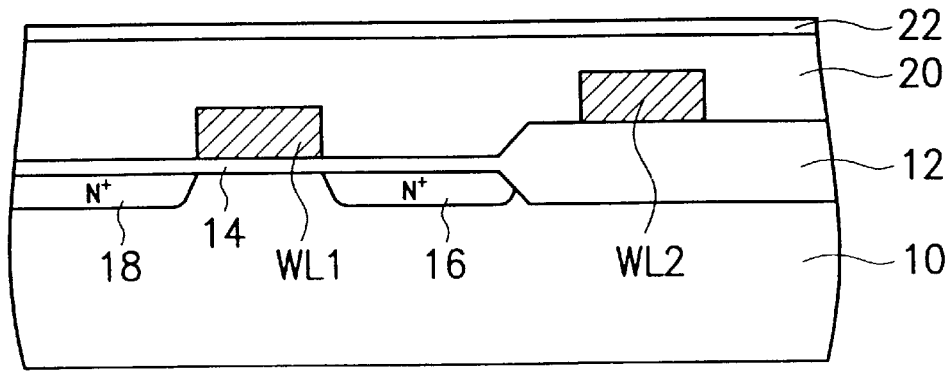

Referring next to FIG. 2B, in a subsequent step an insulating layer 20 such as borophosphosilicate glass (BPSG) is deposited over the entire wafer by chemical-vapor deposition (CVD) to a thickness of about 7,000 Å, for example. After that, the same CVD method is used to deposit an etching protection layer 22 such as a layer of silicon nitride, over the insulating layer 20 to a thickness of, for example, about 1,000 Å.

Figure 2C:
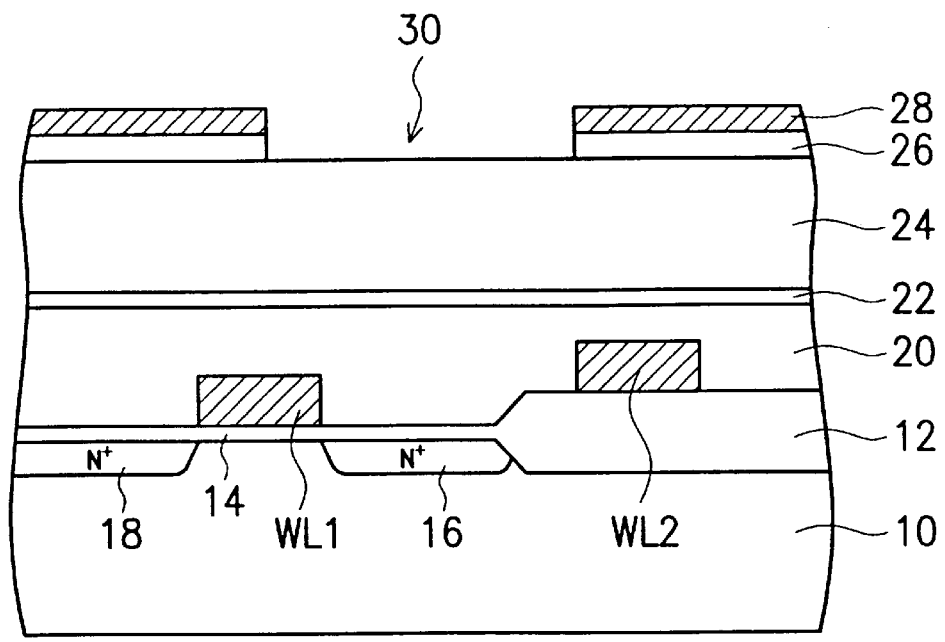

Referring to FIG. 2C, a thick layer 24 of insulating material, such as silicon dioxide, is deposited by the CVD method over the etching protection layer 22 to a thickness of, for example, about 7,000 Å. After that, an insulating layer and a sacrificial polysilicon layer are successively deposited over the insulating layer 24. Then, a conventional photolithographic and etching process is performed on the wafer, so as to remove selected parts of the insulating layer and the sacrificial polysilicon layer. The remaining part of the insulating layer is indicated by the reference numeral 26, and the remaining part of the sacrificial polysilicon layer is indicated by the reference numeral 28, in FIG. 2C. The insulating layer 26 can be, for example, silicon nitride deposited to a thickness of about, for example, 1,000 Å and the sacrificial polysilicon layer 28 is deposited to a thickness of about 1,000 Å, for example. The insulating layer 26 and sacrificial polysilicon layer 28 in combination form a stacked structure (26, 28) having a vertical recess 30 therein. The recess 30 is substantially aligned with the drain region 16 therebelow.

Figure 2D:
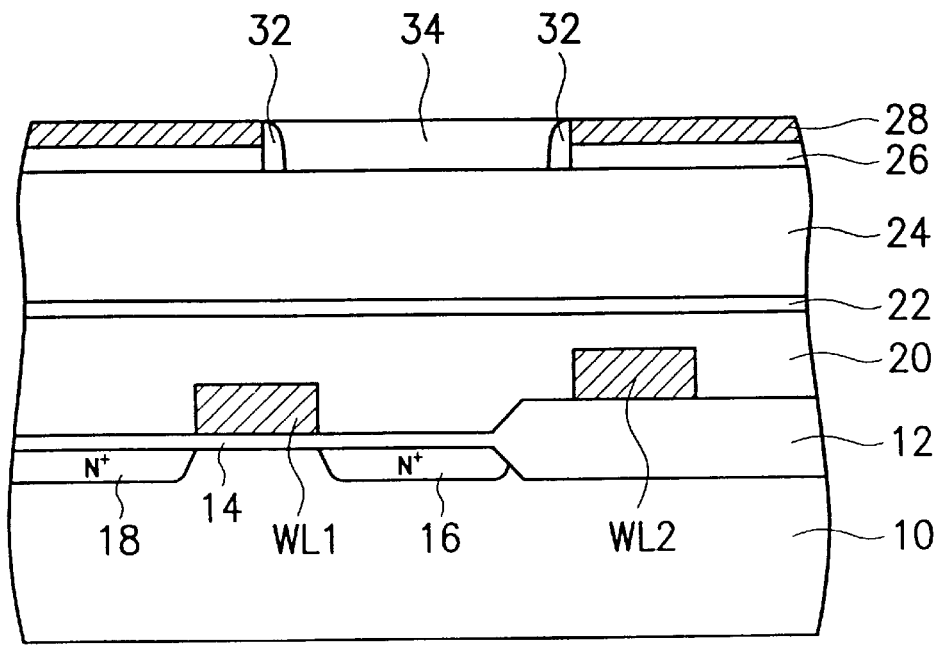

Referring next to FIG. 2D, in the subsequent step, silicon dioxide spacers 32 are formed on the sidewalls of the stacked structure (26, 28). In this embodiment, the silicon dioxide spacers 32 are formed by first depositing a layer of silicon dioxide to a thickness of, for example, about 1,000 Å, and then etching back the silicon dioxide layer. A layer 34 of an insulating material, such as silicon nitride, is then deposited over the wafer by CVD to a thickness of, for example, about 2,000 Å. The insulating layer 34 substantially fills the recess 30. Chemical mechanical polishing (CMP) is then performed on the top surface of the wafer, so as to polish away part of the insulating layer 34, until at least the top surface of the stacked structure (26, 28) is exposed.

Figure 2E:
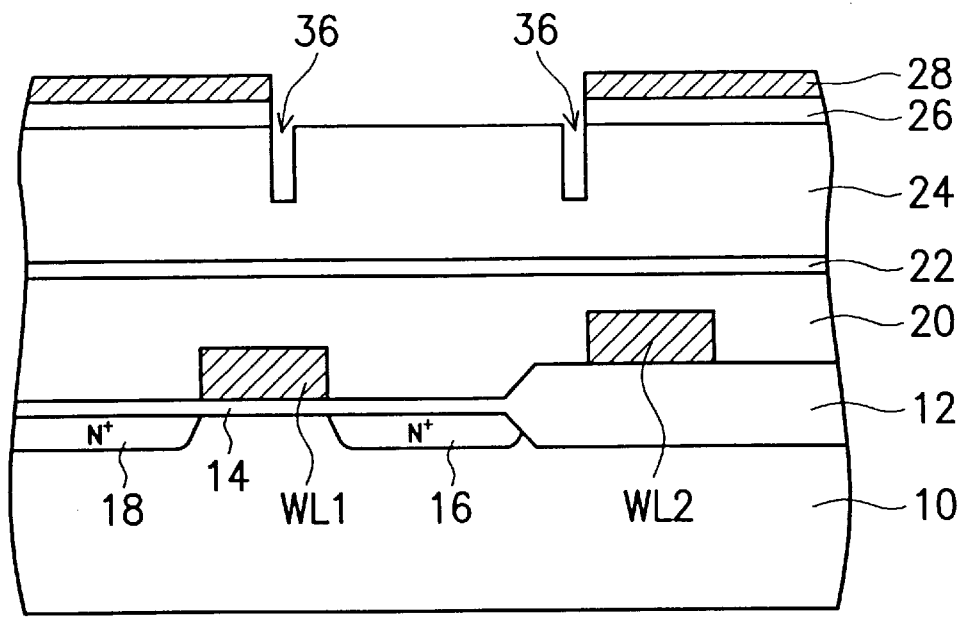

Referring to FIG. 2E, the stacked structure (26, 28) and the insulating layer 34 are next used together as an etching mask, while etching the wafer to remove the silicon dioxide spacers 32. After the silicon dioxide spacers 32 are completely removed, the etching process continues, still using the stacked structure (26, 28) and the insulating layer 34 as an etching mask, to etch away the portions of the insulating layer 24 that are located directly beneath the positions where the silicon dioxide spacers 32 were originally located. The etching is controlled to a predetermined depth to form cavities 36 in the insulating layer 24. It is to be noted that the depth of the cavities 36 can be arbitrarily adjusted but the bottoms of the cavities 36 should be some distance above the top surface of the etching protection layer 22. Subsequently, using the sacrificial polysilicon layer 28 as an etching mask, the wafer is etched to remove the insulating layer 34.

Figure 2F:
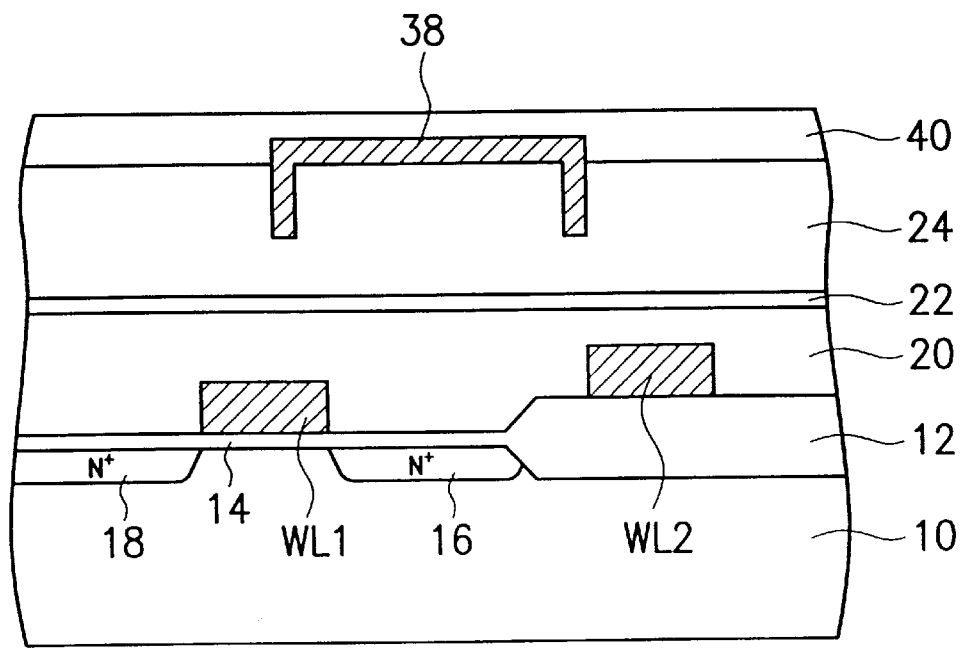

Referring next to FIG. 2F, a polysilicon layer 38 is then deposited over the stacked structure (26, 28) and the insulating layer 24 to a thickness of, for example, about 1,000 Å which substantially fills the cavities 36. The polysilicon layer 38 can be diffused with arsenic ions, for example, to increase the conductivity thereof. After that, CMP is performed on the wafer until at least the top surface of the insulating layer 26 is exposed. The remaining part of the polysilicon layer is indicated by the reference numeral 38 in FIG. 2F. The polishing also removes the sacrificial polysilicon layer 28. Then, using the polysilicon layer 38 and the insulating layer 24 together as an etching protection mask, wet etching is performed on the wafer so as to remove the insulating layer 26. The entire stacked structure (26, 28) is thus removed. An insulating layer 40, formed, for example, of silicon dioxide is then deposited over the wafer by CVD to a thickness of, for example, about 2,000 Å.

Figure 2G:
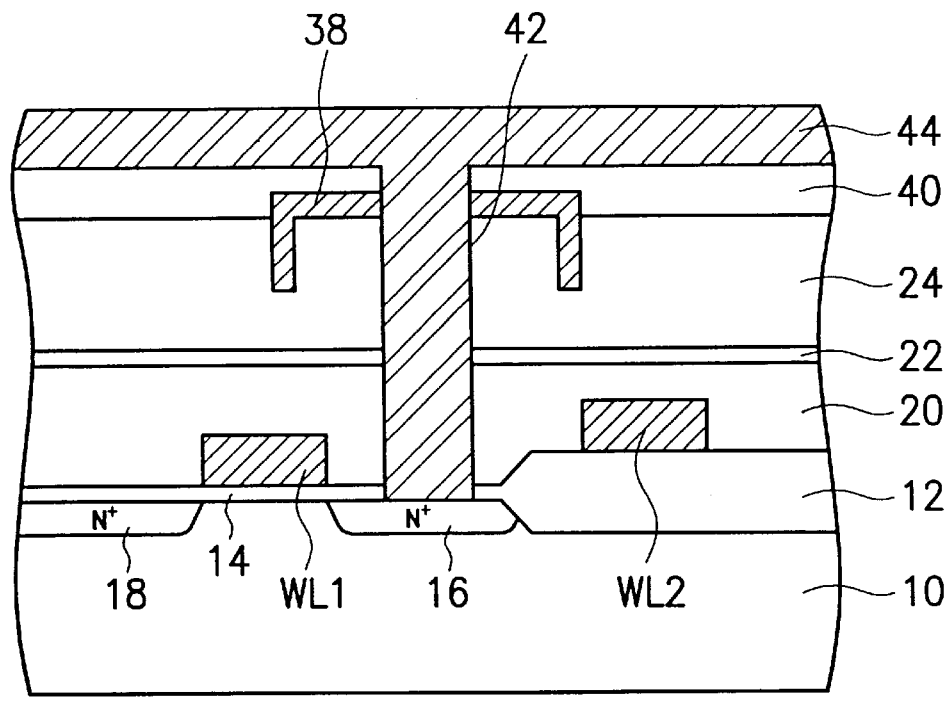

Referring to FIG. 2G, in a subsequent step, a conventional photolithographic and etching process is performed to form a storage electrode contact hole 42 through the insulating layer 40, the polysilicon layer 38, the insulating layer 24, the etching protection layer 22, the insulating layer 20, and the gate oxidation layer 14, to the top surface of the drain region 16. A polysilicon layer 44 is then deposited by CVD to fill the storage electrode contact hole 42 and cover the top surface of the insulating layer 40.

Figure 2H:
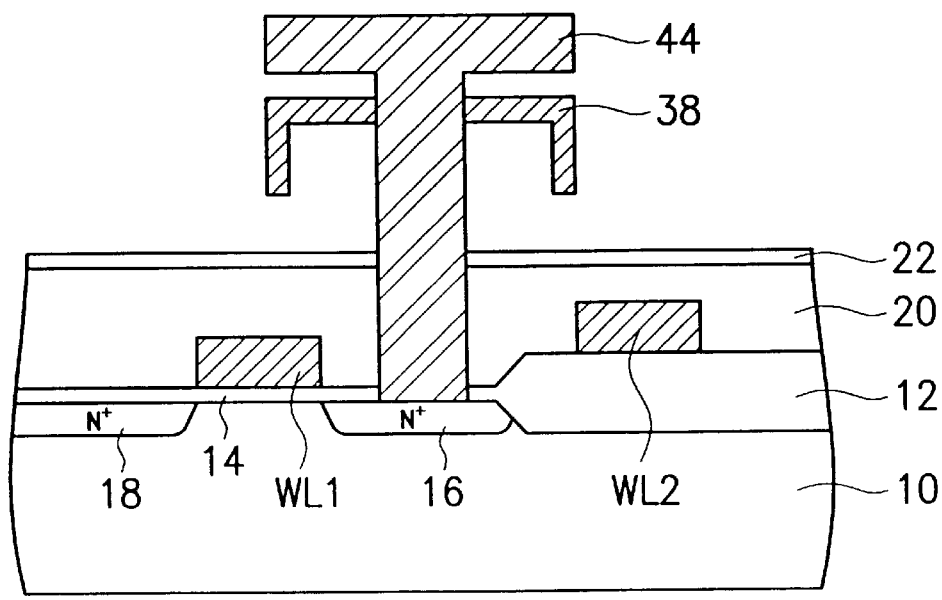

Referring next to FIG. 2H, a conventional photolithographic and etching process is next performed to define the storage electrode for the data storage capacitor of the DRAM cell that is to be formed. Then using the etching protection layer 22 as an etch end point, wet etching is performed on the wafer so as to entirely remove both the insulating layer 40 and the insulating layer 24. This completes the fabrication of the storage electrode for the data storage capacitor of the DRAM cell. As shown in the drawing, the storage electrode includes a trunk-like polysilicon layer 44 which is substantially T-shaped in cross section, and branch-like polysilicon layer sections 38 which are substantially L-shaped in cross section. The trunk-like polysilicon layer 44A has its root 44B (bottom end) electrically connected to the drain region 16 of the transfer transistor of the DRAM cell. The L-shaped branch-like polysilicon layer sections 38 branch out sideways from the upright portion 44A (perpendicular the upright portion 44C of the T-shaped trunk-like polysilicon layer 44A) and then extend downwards toward the substrate 10. Due to its particular overall and component shapes, the storage electrode is hereinafter referred to as a "tree-type storage electrode" in this specification and the data storage capacitor thus made is referred to as a "tree-type capacitor".

Figure 2I:
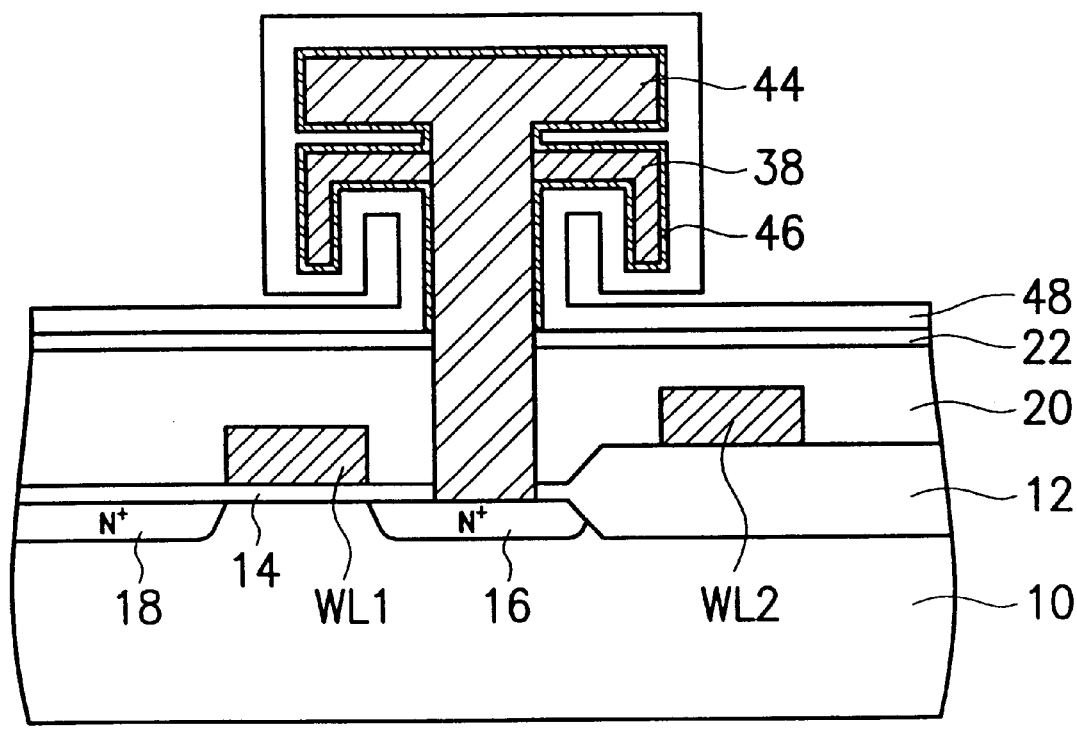

Referring further to FIG. 2I, in a subsequent step a dielectric layer 46, for example, of silicon dioxide, silicon nitride, NO (silicon nitride/silicon dioxide), ONO (silicon dioxide/silicon nitride/silicon dioxide), or the like, is formed over the exposed surfaces of both the trunk-like polysilicon layer 44A and the branch-like polysilicon layer sections 38. Next, to complete the fabrication of the tree-type capacitor, a layer of polysilicon 48 serving as an electrode opposed to the storage electrode (44A, 38), is formed over the dielectric layer 46. The process for forming the opposed electrode 48 includes a first step of depositing the polysilicon by CVD to a thickness of, for example, about 1,000 Å, a second step of diffusing N-type impurities into the polysilicon to increase the conductivity thereof, and a final step of performing a conventional photolithographic and etching process on the polysilicon to form the desired opposed electrode 48.

To complete fabrication of the DRAM cell, the subsequent steps include the fabrication of bit lines, bonding pads, interconnections, passivations, and packaging. These steps involve only conventional techniques so that a description thereof need not be provided herein.

Second Embodiment

In the foregoing first embodiment, each storage electrode includes only one L-shaped branch-like conductive layer having two sections. However, the invention is not limited to the use of just one set of L-shaped branch-like conductive layer sections. Two or more sets of L-shaped branch-like conductive layer sections can be provided. The second embodiment here has a storage electrode with two L-shaped, branch-like conductive layer sets.

FIGS. 3A through 3E are sectional views depicting the steps involved in a method for fabricating a second embodiment of the semiconductor memory device according to the invention, which device includes a tree-type capacitor storage electrode having two sets of L-shaped branches. The tree-type capacitor of the second embodiment is based on the structure of FIG. 2F. Elements in FIG. 3A through 3E that are identical in structure and purpose to those in FIG. 2F are labeled with the same reference numerals.

Figure 3A:
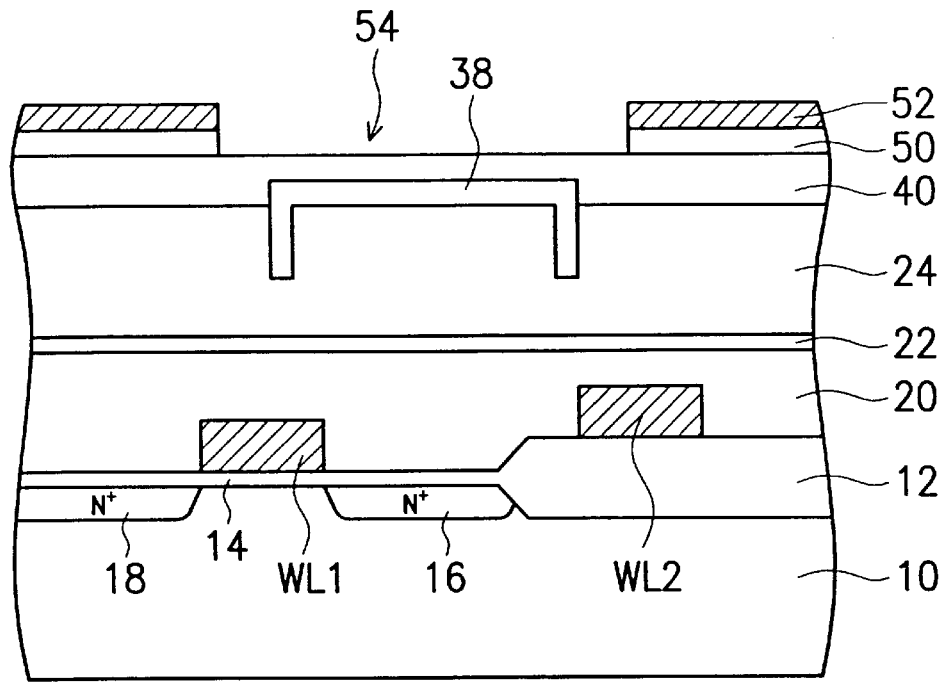
FIGS. 3A through 3E are sectional views depicting the steps involved in a method for fabricating a semiconductor memory device according to a second embodiment of the invention.

Referring to FIG. 3A together with FIG. 2F, after producing the structure of FIG. 2F, an insulating layer and a sacrificial polysilicon layer are successively deposited over the insulating layer 40. Then a conventional photolithographic and etching process is performed to removed selected parts of both the insulating layer and the sacrificial layer. The remaining part of the insulating layer is indicated by the reference numeral 50, and the remaining part of the sacrificial polysilicon layer is indicated by the reference numeral 52 in FIG. 3A. The insulating layer 50 can be formed of silicon nitride deposited to a thickness of, for example, about 1,000 Å and the sacrificial polysilicon layer 52 is deposited to a thickness of, for example, about 1,000 Å. The insulating layer 50 and the sacrificial polysilicon layer 52, in combination, form a stacked structure (50, 52) having a recess 54 therein. The recess 54 here is larger in width than the recess 30 formed in the earlier performed steps shown in FIG. 2C, and is substantially aligned vertically with the drain region 16.

Figure 3B:
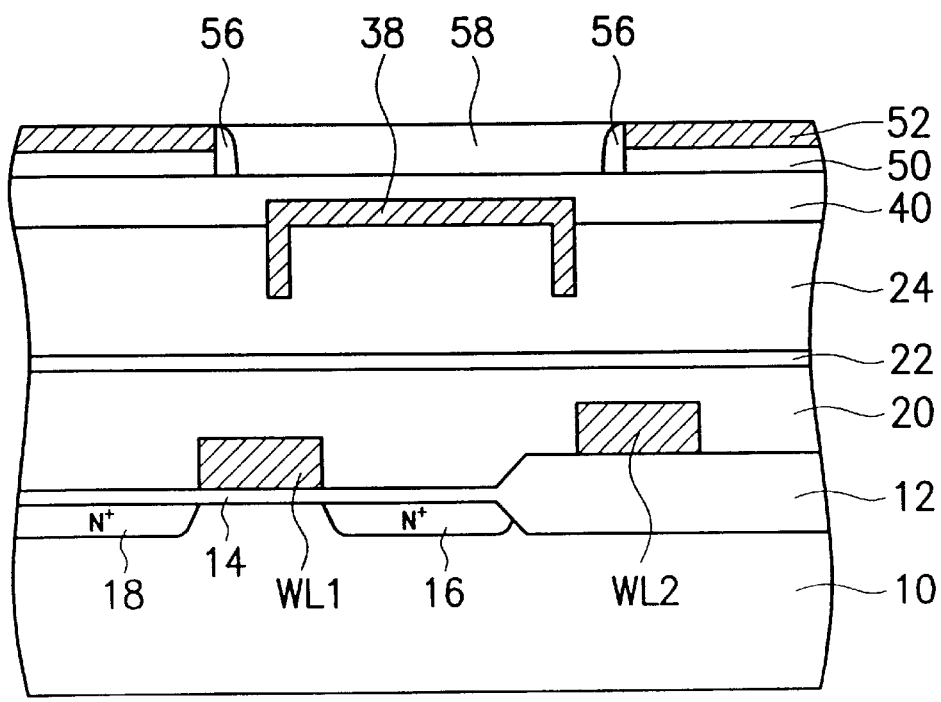

Referring next to FIG. 3B, in a subsequent step, silicon dioxide spacers 56 are formed on the sidewalls of the stacked structure (50, 52). In this embodiment, the silicon dioxide spacers 56 are formed by first depositing a layer of silicon dioxide to a thickness of, for example, about 1,000 Å and then etching the layer back. An insulating layer 58 is then formed, for example, by depositing silicon nitride by CVD over the wafer, to a thickness of, for example, about 2,000 Å. The insulating layer 58 substantially fills the recess 54. After that, the top surface of the wafer is subjected to CMP to polish away part of the insulating layer 58 until at least the top surface of the stacked structure (50, 52) is exposed.

Figure 3C:
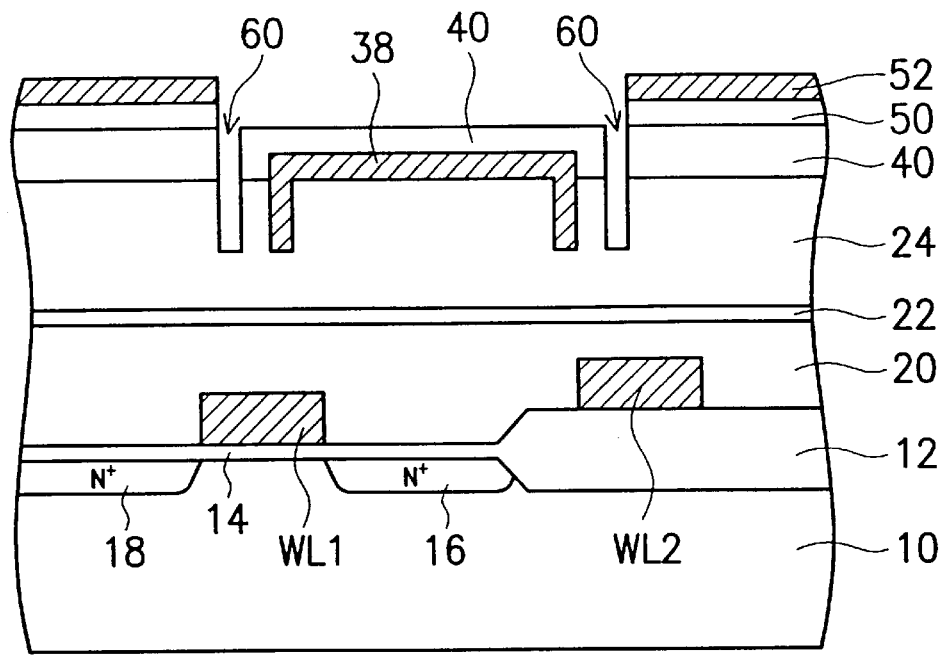

Referring next to FIG. 3C, using the stacked structure (50, 52) and the insulating layer 58 together as an etching mask, the wafer is etched to remove the silicon dioxide spacers 56. After the silicon dioxide spacers 56 are completely removed, the etching continues, still using the stacked structure (50, 52) and the insulating layer 58 together as an etching mask, to etch away portions of the insulating layer 58 that are located directly beneath the positions where the silicon dioxide spacers 56 were originally located. The etching is controlled to a predetermined depth to form cavities 60 in the insulating layer 58. It is to be noted that the depth of the cavities 60 can be arbitrarily adjusted, but the bottom of the cavities 60 should be a distance above the top surface of the etching protection layer 22. After the cavities 60 are fully formed, the wafer is further etched to remove the insulating layer 58 using the sacrificial polysilicon layer 52 as an etching mask.

Figure 3D:
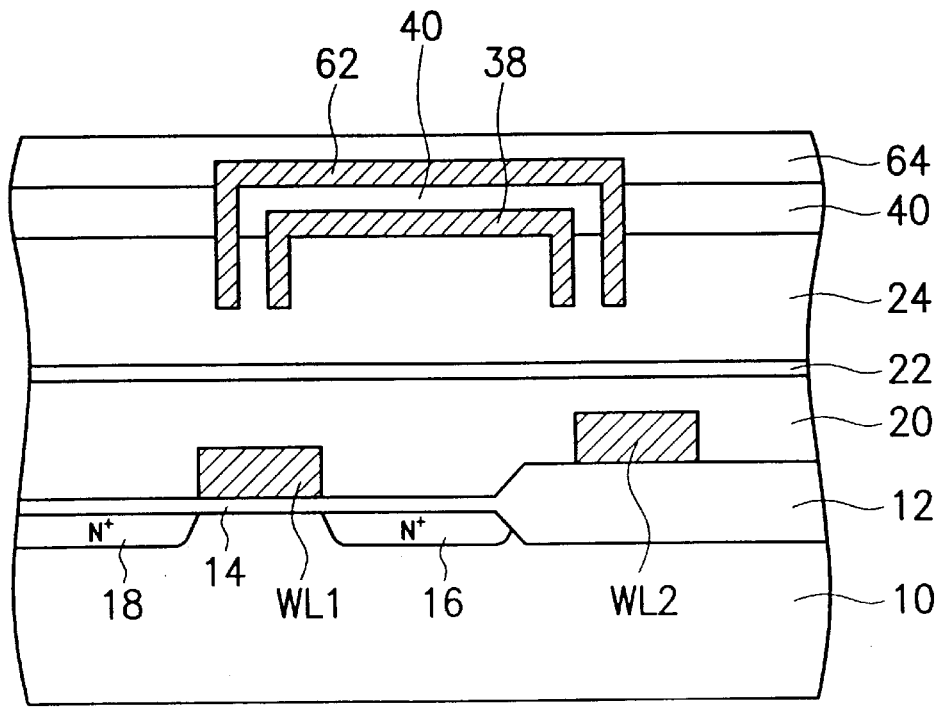

Referring to FIG. 3D, in a subsequent step, a polysilicon layer is deposited over both the stacked structure (50, 52) and the insulating layer 40 to a thickness of, for example, about 1,000 Å which substantially fills the cavity 60. The polysilicon layer can be diffused with arsenic ions, for example, to increase the conductivity thereof After that, CMP is performed until at least the top surface of the insulating layer 50 is exposed. The remaining part of the polysilicon layer is indicated by the reference numeral 62 in FIG. 3D. Through this process, the sacrificial polysilicon layer 52 is removed. Then, using he polysilicon layer 62 and the insulating layer 40 together as an etching protection mask, wet etching is performed on the wafer to remove the insulating layer 50. The entire stacked structure (50, 52) is thereby removed. Then an insulating layer 64, such as a silicon dioxide layer, is deposited by CVD to a thickness of, for example, about 2,000 Å.

Figure 3E:
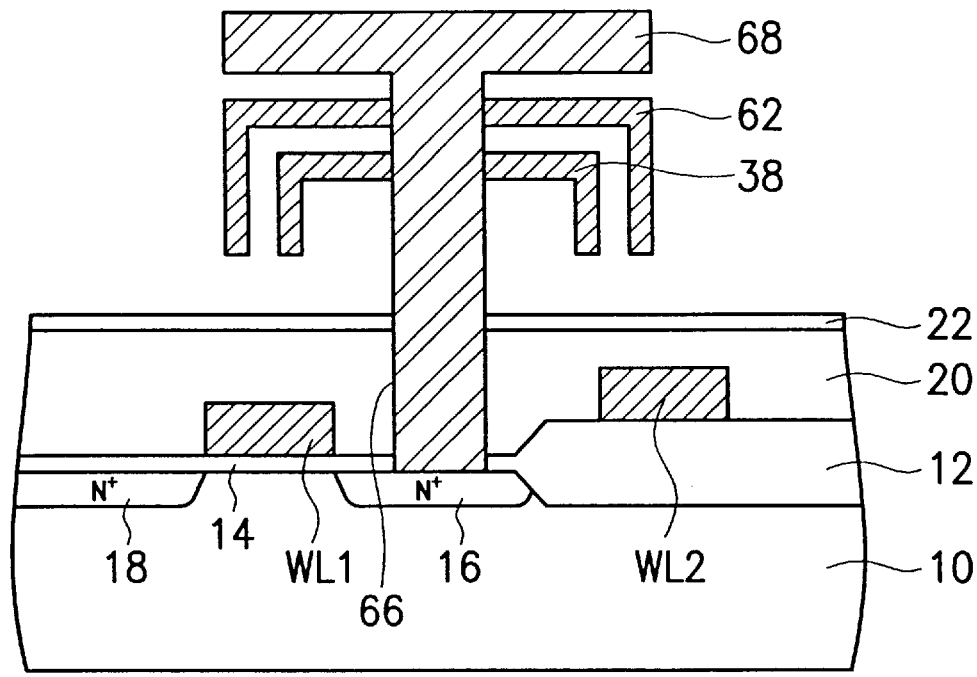

Referring next to FIG. 3E, a conventional photolithographic and etching process is next performed to form a storage electrode contact hole 66 through the insulating layer 64, the polysilicon layer 62, the insulating layer 40, the polysilicon layer 38, the insulating layer 24, the etching protection layer 22, the insulating layer 20, and the gate oxidation layer 14, to the top surface of the drain region 16. After that, a polysilicon layer 68 is deposited by CVD over the insulating layer 64 to fill the storage electrode contact hole 66 and cover the top surface of the insulating layer 64.

Subsequently, a further conventional photolithographic and etching process is performed on the wafer to define the location of the storage electrode for the data storage capacitor of the DRAM cell that is to be formed. After that, using the etching protection layer 22 as an etch end point, a wet etching process is performed on the wafer to entirely remove the silicon dioxide insulating layers 64, 40, and 24. This completes the fabrication of the storage electrode for the data storage capacitor of the DRAM cell.

As shown in FIG. 3E, the storage electrode includes a trunk-like polysilicon layer 68 which is substantially T-shaped in cross section, and two branch-like polysilicon layers 62 and 38 which each have two substantially L-shaped sections in cross section. The trunk-like polysilicon layer 68 has its root 68B (bottom end) electrically connected to the drain region 16 of the transfer transistor of the DRAM cell. The two sets of L-shaped branch-like polysilicon layers 62 and 38 each branch out sideways (horizontally, i.e., parallel to the substrate surface) from the upright portion 68A of this T-shaped trunk-like polysilicon layer 68, and then extend downward. All the subsequent steps are conventional steps to complete the fabrication of the DRAM cell, so that a description thereof need not be provided herein.

Third Embodiment

In the foregoing first and second preferred embodiments, each tree-type capacitor has a trunk-like portion which is substantially T-shaped in cross section. However, the invention is not limited to forming the trunk-like portion in such a shape. The trunk-like conductive layer can also be an upright pillar, as is described below.

Figure 4:
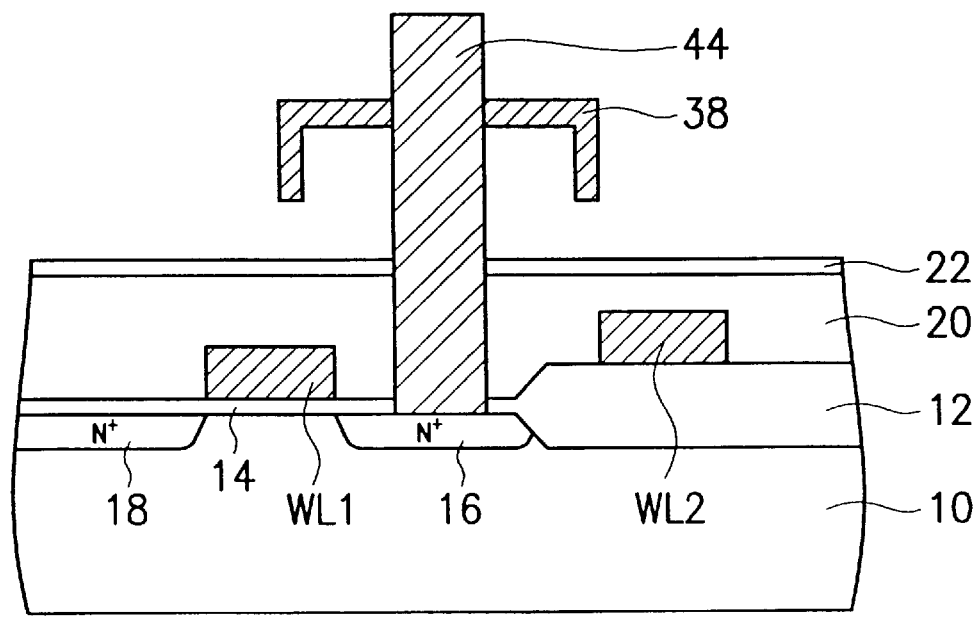
FIG. 4 is a sectional view of a third embodiment of the semiconductor memory device of the invention.

FIG. 4 shows a sectional diagram depicting the steps involved in a method for fabricating the third embodiment of the invention, which includes a tree-type capacitor having a pillar-shaped, trunk-like conductive layer. The tree-type capacitor of this embodiment is based on the structure of FIG. 2G. Elements in FIG. 4 that are identical in structure and purpose to those in FIG. 2G are labeled with the same reference numerals.

Referring to FIG. 4 together with FIG. 2G, upon completion of the structure shown in FIG. 2G, CMP is performed on the wafer to polish away the horizontal portion 44A of the polysilicon layer 44 until at least the top surface of the insulating layer 40 is exposed, leaving only the upright portion 44C of the polysilicon layer 44, which is substantially pillar-shaped. Wet etching is then performed using the etching protection layer 22 as an etch end point, to entirely remove the silicon dioxide insulating layers 40 and 24. This completes the fabrication of the storage electrode for the data storage capacitor of the DRAM cell. As shown in FIG. 4, the storage electrode includes a trunk-like polysilicon layer 44C which is substantially pillar-shaped, and a branch-like polysilicon layer 38 which has two sections substantially L-shaped in cross section. The pillar-shaped, trunk-like polysilicon layer 44C has its root 44B (bottom end) electrically connected to the drain region 16 of the transfer transistor of the DRAM cell. The L-shaped branch-like polysilicon layers 38 branch out sideways (perpendicular to the trunk-like layer 44C and parallel to the upper surface of the substrate 10) from the polysilicon layer 44C and then extend downward toward the substrate 10. All subsequent steps to complete the fabrication of the DRAM cell are conventional, so that such steps need not be further described.

In this third preferred embodiment, the pillar-shaped, trunk-like conductive layer 44C is formed using CMP. However, it can alternatively be formed by etching back to remove the horizontal portion 44A of the polysilicon layer 44 shown in FIG. 2G leaving the upright portion 44C. Another alternative way to form the pillar-shaped trunk-like conductive layer 44C is to epitaxially grow a polysilicon layer in the storage electrode contact hole 42. The grown epitaxial polysilicon layer then serves as the pillar-shaped, trunk-like conductive layer 44C.

Fourth Embodiment

In the foregoing first, second, and third embodiments, the trunk-like portion of each storage electrode is an integral element and each branch-like conductive layer, in sectional view, includes two L-shaped sections or offshoots from the upright portion of the trunk-like conductive layer.

However, the invention is not limited to such structures. A fourth exemplary embodiment includes a storage electrode having a trunk-like conductive layer consisting of two or more trunk-like segments and a branch-like conductive layer having two offshoots, one offshoot being substantially L-shaped in cross section (formed of one horizontal segment and one vertical segment) and the other offshoot consisting only of one horizontal segment.

FIGS. 5A through 5E are sectional views depicting the steps involved in a method for fabricating the fourth embodiment. The tree-type capacitor of the fourth embodiment is based on the structure of FIG. 2B. Elements in FIGS. 5A through 5E that are substantially identical in structure and purpose to those in FIG. 2B are labeled with the same reference numerals.

Figure 5A:
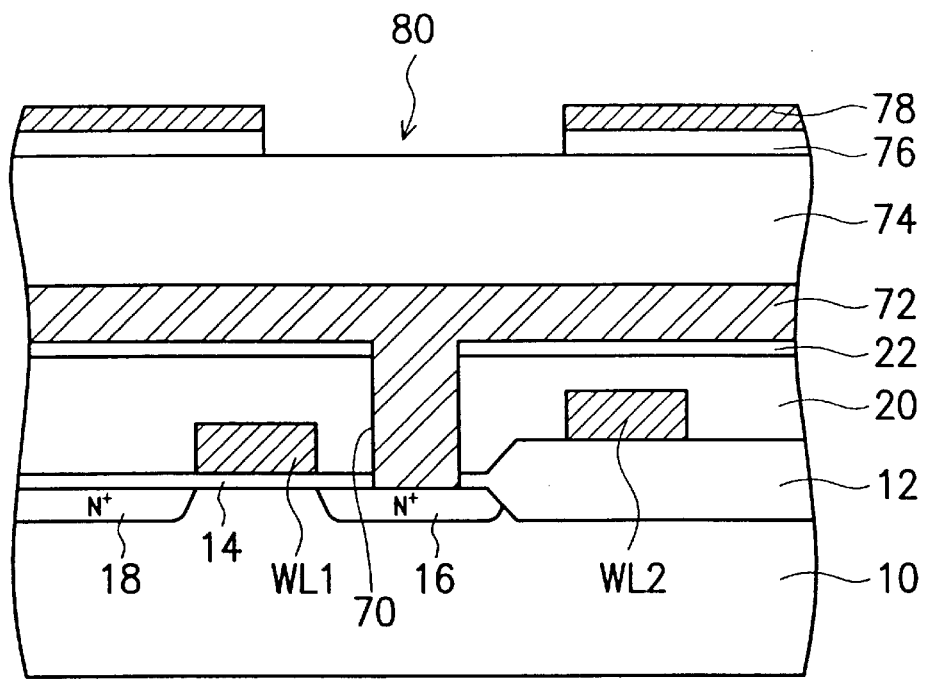
FIGS. 5A through 5E are sectional views depicting the steps involved in a method for fabricating a semiconductor memory device according to a fourth preferred embodiment of the invention.

Referring to FIG. 5A together with FIG. 2B, after completion of the structure of FIG. 2B, a conventional photolithographic and etching process is used to form a storage electrode contact hole 70 through the etching protection layer 22, the insulating layer 20, and the gate oxidation layer 14 to the top surface of the drain region 16. Then, a polysilicon layer 72 is deposited by CVD. The polysilicon layer 72 can be diffused with arsenic ions, for example, to increase the conductivity thereof. As shown in FIG. 5A, the polysilicon layer 72 fills the storage electrode contact hole 70 and covers the top surface of the etching protection layer 22. Next, a thick insulating layer 74 is formed, for example by depositing silicon dioxide over the polysilicon layer 72 to a thickness of, for example, about 7,000 Å. After that, an insulating layer and a sacrificial polysilicon layer are successively deposited over the insulating layer 74 by CVD. A conventional photolithographic and etching process is then performed on the wafer to remove selected tarts of the insulating layer and the sacrificial layer. The remaining part of the insulating layer is indicated by the reference numeral 76, and the remaining part of the sacrificial polysilicon layer is indicated by the reference numeral 78, in FIG. 5A. The insulating layer 76 can be formed by depositing, for example, silicon nitride to a thickness of, for example, about 1,000 Å, and the sacrificial polysilicon layer 78 is deposited to a thickness of, for example, about 1,000 Å. The insulating layer 76 and the sacrificial polysilicon layer 78, in combination, form a stacked structure (76, 78) having a recess 80 therein. The recess 80 is substantially aligned vertically with one side (the left side in FIG. 5A) of the drain region 16.

Figure 5B:
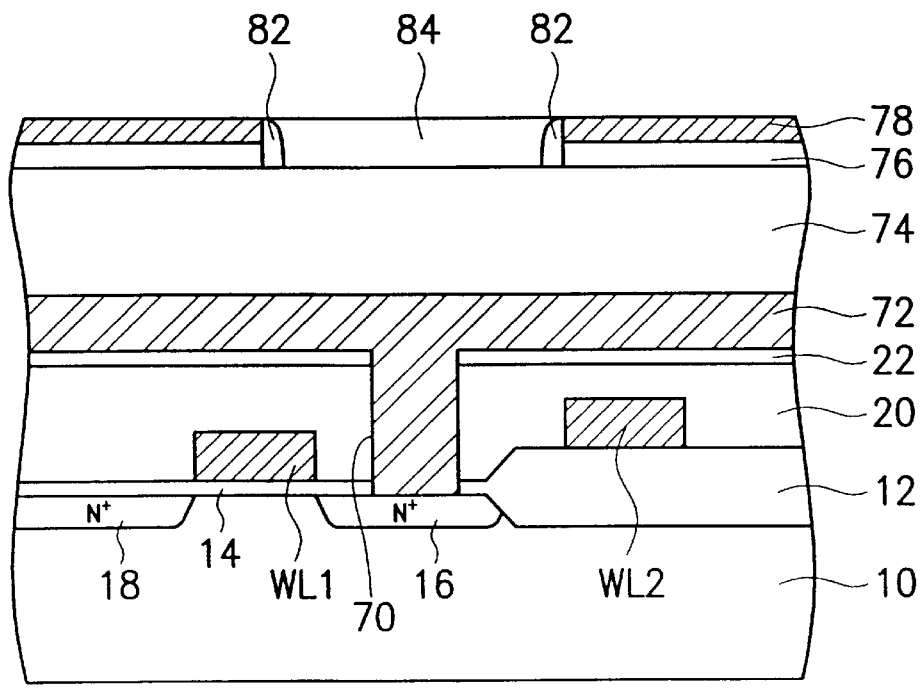

Referring next to FIG. 5B, silicon dioxide spacers 82 are then formed on the sidewalls of the stacked structure (76, 78). In this embodiment, the silicon dioxide spacers 82 are formed by first depositing a layer of silicon dioxide to a thickness of, for example, about 1,000 Å, and then etching the layer back. Next, an insulating layer 84 of, for example, silicon nitride, is deposited over the wafer by CVD to a thickness of, for example, about 2,000 Å. The insulating layer 84 substantially fills the recess 80. Then CMP is conducted on the insulating layer 84 until at least the top surface of the stacked structure (76, 78) is exposed.

Figure 5C:
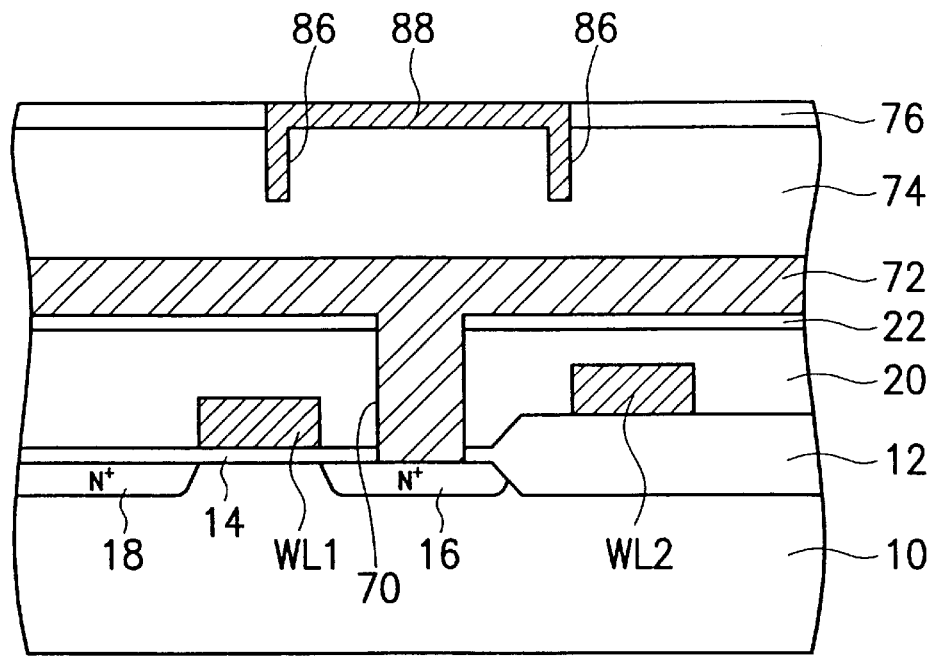

Referring next to FIG. 5C, using the stacked structure (76, 78) and the insulating layer 84 together as an etching mask, the wafer is etched to remove the silicon dioxide spacers 82. After the spacers 82 are completely removed, the etching continues, still using the stacked structure (76, 78) and the insulating layer 84 together as an etching mask, to etch away portions of the insulating layer 74 that are located directly beneath the positions where the spacers 82 were originally located. The etching is controlled to form cavities 86 of a predetermined depth in the insulating layer 74. It is to be noted that the depth of the cavities 86 can be arbitrarily adjusted, but the bottom of the cavities 86 should be a distance above the top surface of the polysilicon layer 72. Next, using the sacrificial polysilicon layer 78 as an etching mask, etching is performed to remove the insulating layer 84. Subsequently, a polysilicon layer is deposited over both the stacked structure (76, 78) and the insulating layer 74 to a thickness of, for example, about 1,000 Å, which substantially fills the cavities 86 and 80. The polysilicon layer can be diffused with arsenic ions, for example, to increase the conductivity thereof. Then CMP is performed until at least the top surface of the insulating layer 76 is exposed. The remaining part of the polysilicon layer is indicated by the reference numeral 88 in FIG. 5C. Through this process, the sacrificial polysilicon layer 78 is also removed.

Figure 5D:
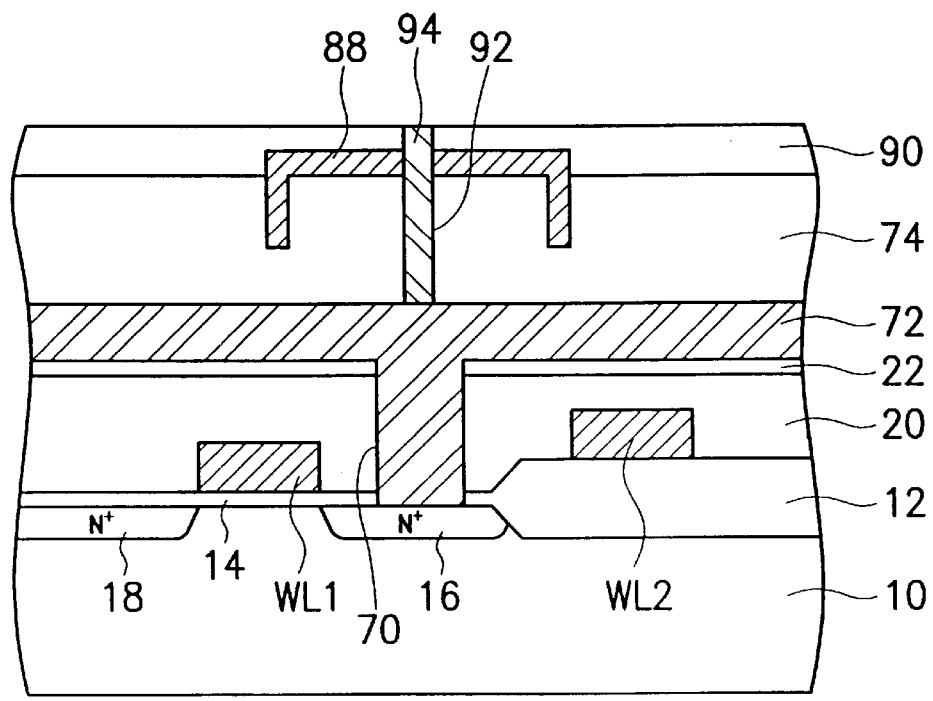

Referring next to FIG. 5D, using the polysilicon layer 88 and the insulating layer 74 together as an etching protection mask, wet etching is performed to remove the insulating layer 76. The entire stacked structure (76, 78) is thus removed by this process. An insulating layer 90 of, for example, silicon dioxide is then deposited by CVD, to a thickness of, for example, about 2,000 Å. A conventional photolithographic and etching process is next performed on the wafer to successively etch away selected parts of the insulating layer 90, the polysilicon layer 88, and the insulating layer 74, until the top surface of the polysilicon layer 72 is exposed, thereby forming a hole 92 and separating the polysilicon layer 88 into left and right L-shaped branches (offshoots) 88A and 88B. Subsequently, in the hole 92, a solid pillar-like polysilicon layer 94 is formed, for example, epitaxially or by a deposition and etching process.

Figure 5E:
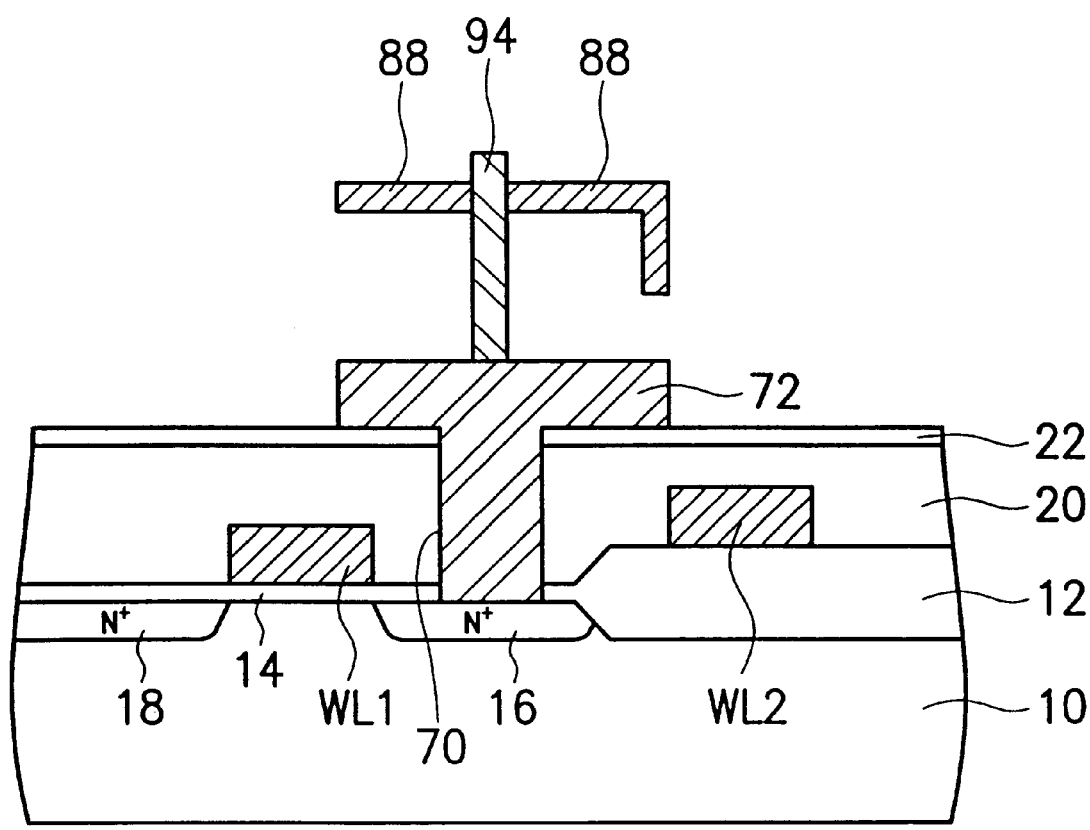

Referring now to FIG. 5E, a further conventional photolithographic and etching process is next performed on the wafer for selective removal of portions of the polysilicon layers 88 and 72, to define a storage electrode for the data storage capacitor of the DRAM cell that is to be formed. By this process, the vertical segment 88B2 of the left L-shaped branch 88B of polysilicon layer 88 is removed, leaving only its horizontal segment 88B1 as an offshoot. After that, using the etching protection layer 22 as an etch end point, the wafer is wet etched to remove the silicon dioxide insulating layers 90 and 74. This completes the fabrication of the storage electrode for the data storage capacitor of the DRAM cell. As shown in the drawing, the storage electrode includes a bottom trunk-like conductive layer 72A, a top trunk-like polysilicon layer 94 extending away from the bottom trunk-like conductive layer 72A, and a branch-like conductive layer consisting of a first offshoot 88A to the right which is substantially L-shaped in cross section, and a second offshoot 88B1 to the left which includes only a horizontal segment. The bottom trunk-like conductive layer 72A is substantially T-shaped in cross section and has its root 72B (bottom end) electrically connected to the drain region 16 of the transfer transistor of the DRAM cell. The top trunk-like polysilicon layer 94 is substantially pillar-shaped, extending upright from the top surface 72C of the bottom trunk-like conductive layer 72A. The branch-like polysilicon layer (88A, 88B1) branches out sideways from the top trunk-like polysilicon layer 94, that is, horizontally and substantially perpendicular to the layer 94.

Fifth Embodiment

Further to the foregoing four exemplary embodiments, the fifth embodiment has a tree-type capacitor which includes a storage electrode having L-shaped branch-like conductive layers together with horizontally extended branch-like conductive layers.

Moreover, in the foregoing fourth embodiment, the horizontal portion of the bottom trunk-like conductive layer 72A contacts the underlying etching protection layer 22. However, the invention is not so limited. The bottom surface of the horizontal portion of the bottom trunk-like conductive layer 72A can be separated from the underlying etching protection layer 22 by some distance in order to further increase the surface area of the storage electrode.

FIGS. 6A through 6E are sectional views depicting the steps involved in a method for fabricating a fifth preferred embodiment of the invention, in which the tree-type capacitor is based on the structure of FIG. 2B. Elements shown in FIG. 6A through 6E that are substantially identical in structure and purpose to those in FIG. 2B are labeled with the same reference numerals.

Figure 6A:
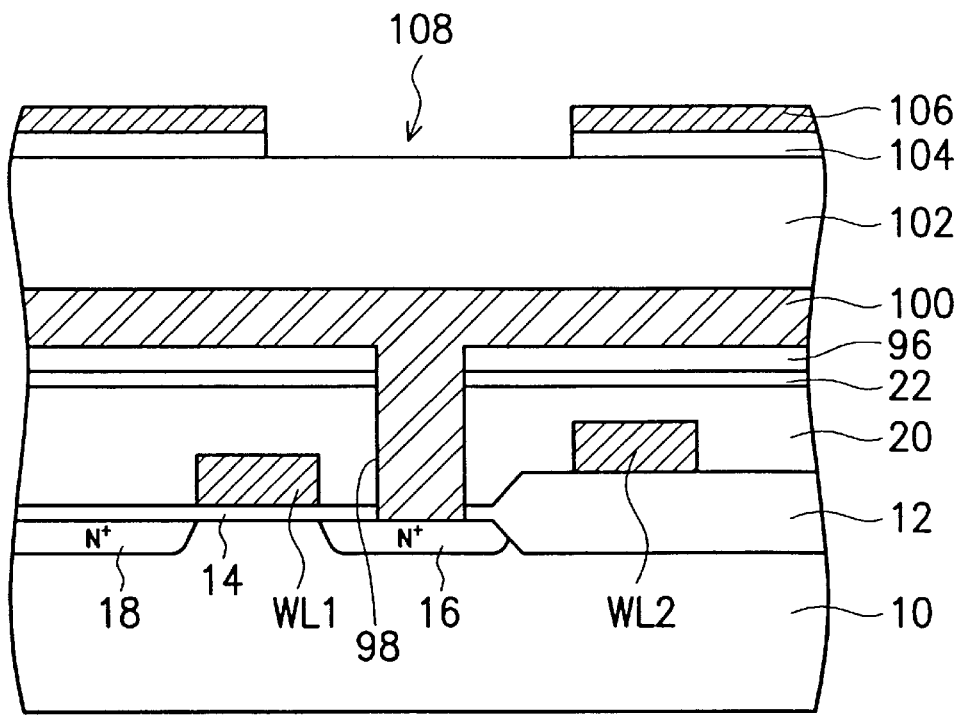
FIGS. 6A through 6E are sectional views depicting the steps involved in a method for fabricating a semiconductor memory device, according to a fifth preferred embodiment of the invention.

Referring to FIG. 6A together with FIG. 2B, after completion of the structure of FIG. 2B, an insulating layer 96 is formed for example, by depositing, silicon dioxide by CVD over the etching protection layer 22, to a thickness of, for example, about 1,000 Å. A conventional photolithographic and etching process is then performed on the wafer so as to form a storage electrode contact hole 98 through the insulating layer 96, the etching protection layer 22, the insulating layer 20, and the gate oxidation layer 14, to the top surface of the drain region 16. Next, a polysilicon layer 100 is deposited by CVD over the insulating layer 96. The polysilicon layer 100 can be diffused with arsenic ions, for example, to increase the conductivity thereof. The polysilicon layer 100 fills the storage electrode contact hole 98 and covers the top surface of the insulating layer 96. Then, a thick insulating layer 102, of silicon dioxide, for example is deposited over the polysilicon layer 100 to a thickness of, for example, 7,000 Å. Next, an insulating layer and a sacrificial polysilicon layer are successively deposited over the insulating layer 102. Then a conventional photolithographic and etching process is performed to remove selected parts of the insulating layer and the sacrificial layer. The remaining part of the insulating layer is indicated by the reference numeral 104, and the remaining part of the sacrificial polysilicon layer is indicated by the reference numeral 106, in FIG. 6A. The insulating layer 104 can be a layer of silicon nitride having a thickness of, for example, about 1,000 Å and the sacrificial polysilicon layer 106 is deposited to a thickness of about 1,000 Å, for example. The insulating layer 104 and the sacrificial polysilicon layer 106, in combination, form a stacked structure (104, 106) having a recess 108 therein. The recess 108 is substantially vertically aligned with the drain region 16.

Figure 6B:
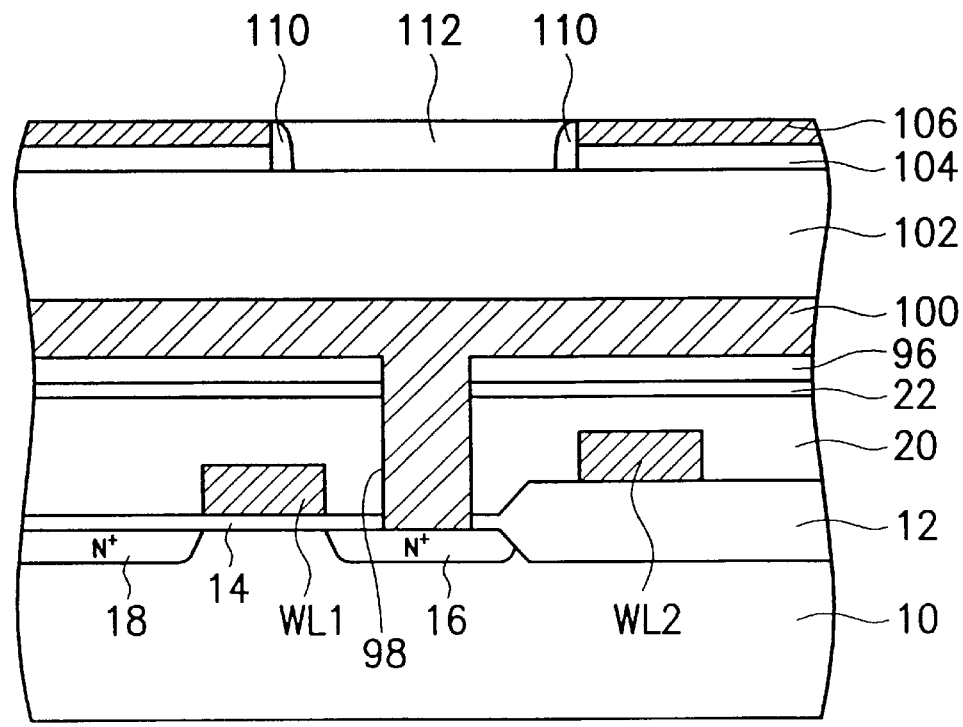

Referring next to FIG. 6B, silicon dioxide spacers 110 are then formed on the sidewalls of the stacked structure (104, 106). In this embodiment, the silicon dioxide spacers 110 are formed by first depositing a layer of silicon dioxide to a thickness of, for example about 1,000 Å, and then etching the layer back. An insulating layer 112 of, for example, silicon nitride, is then deposited by CVD to a thickness of, for example, about 2,000 Å. The insulating layer 112 substantially fills the recess 108. Next, CMP is performed on the top surface to polish away part of the insulating layer 112, until at least the top surface of the stacked structure (104, 106) is exposed.

Figure 6C:
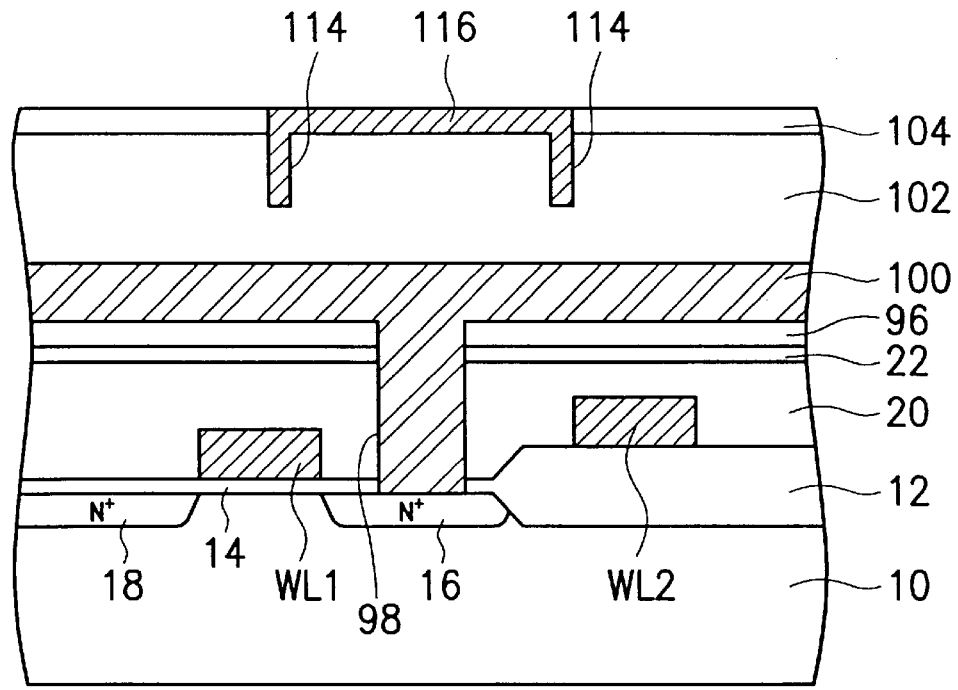

Referring next to FIG. 6C, using the stacked structure (104, 106) and the insulating layer 112 together as an etching mask, etching is performed to remove the silicon dioxide spacers 110. After the silicon dioxide spacers 110 ire completely removed, the etching process continues, still using the stacked structure (104, 106) and the insulating layer 112 together as etching mask, to etch away the portions of the insulating layer 102 that are located directly beneath the positions where the silicon dioxide spacers 110 were originally located. The etching is controlled to a predetermined depth to form cavities 114 in the insulating layer 102. It is to be noted that the depth of the cavities 114 can be arbitrarily adjusted, but the bottom of the cavities 114 should be some distance above the top surface of the polysilicon layer 100. Then, using the sacrificial polysilicon layer 106 as an etching mask, etching is performed to remove the insulating, layer 112. Subsequently, a polysilicon layer is deposited over the stacked structure (104, 106) and the insulating layer 102 to a thickness of, for example, about 1,000 Å, which substantially fills the cavities 114 and 108. The polysilicon layer can be diffused with arsenic ions, for example, to increase the conductivity thereof. Next, CMP is performed on the polysilicon layer until at least the top surface of the insulating layer 104 is exposed. The remaining part of the polysilicon layer is indicated by the reference numeral 116 in FIG. 6C. By this process, the sacrificial polysilicon layer 106 has been completely removed.

Figure 6D:
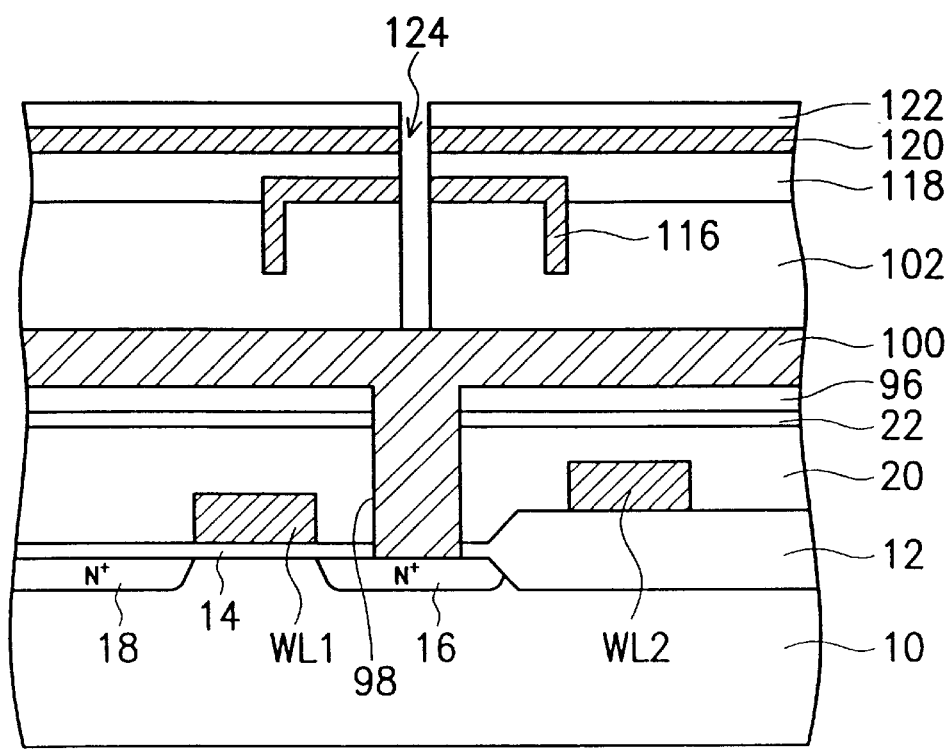

Referring next to FIG. 6D, using the polysilicon layer 116 and the insulating layer 102 together as an etching protection mask, the wafer is now wet etched to remove the insulating layer 104. The entire stacked structure (104, 106) is thus removed by this process. Then, CVD is used to deposit successively an insulating layer 118, a polysilicon layer 120, and an insulating layer 122. The insulating layer 118 can be formed of for example silicon dioxide, to a thickness of, for example, about 2,000 Å, and similarly, the insulating layer 122 can be formed of silicon dioxide, for example, but to a thickness of only, for example, about 1,000 Å. The polysilicon layer 120 can be diffused with arsenic ions, for example, to increase the conductivity thereof. Then, using a conventional photolithographic and etching process, a hole 124 is formed in a selected position of the wafer that is substantially aligned with the drain region 16, by etching successively through the insulating layer 122, the polysilicon layer 120, the insulating layer 118, the polysilicon layer 116, and the insulating layer 102, until the top surface of the polysilicon layer 100 is exposed.

Figure 6E:
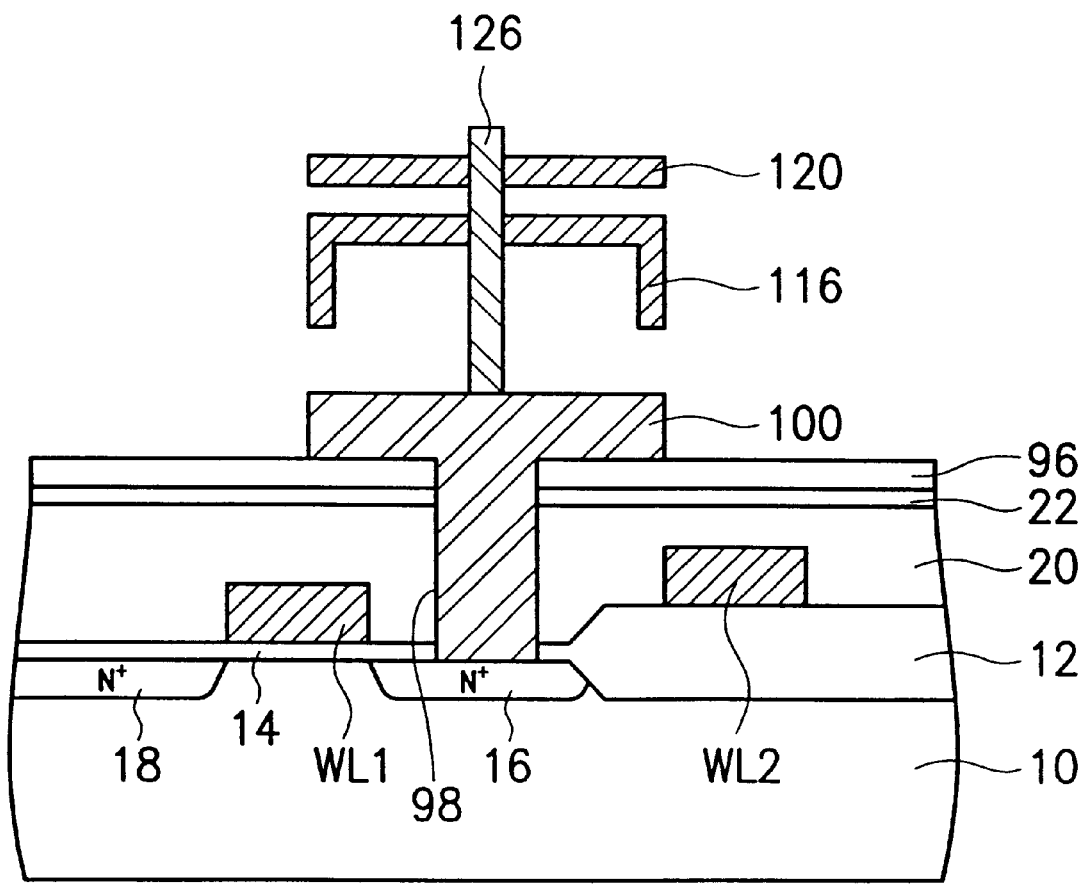

Referring next to FIG. 6E, a solid pillar-like polysilicon layer 126 is formed in the hole 124, for example, epitaxially or by a deposition and etch back process. Subsequently, a further conventional photolithographic and etching process is performed on the polysilicon layers 120 and 100 to reduce their horizontal dimensions and thereby define a storage electrode for the data storage capacitor of the DRAM cell, having branch-like polysilicon layers 120A and 116 and a bottom trunk-like polysilicon layer 100A. Then, using the etching protection layer 22 as an etch end point, wet etching is performed to entirely remove the exposed silicon dioxide insulating layers 122, 118, 102, and 96. This completes the fabrication of the storage electrode for the data storage capacitor of the DRAM cell.

As shown in FIG. 6E, this storage electrode includes the bottom trunk-like polysilicon layer 100A which is substantially T-shaped in cross section, a top trunk-like polysilicon layer 126 extending from the bottom trunk-like polysilicon layer 100A, and two branch-like polysilicon layers 120A and 116 of which the branch-like polysilicon layer 116 includes two offshoots 116A and 116B to either side that are each substantially L-shaped in cross section, and the branch-like polysilicon layer 120A also includes two offshoots 120A1 and 120A2 to either side but which are each substantially rectangular. The bottom trunk-like polysilicon layer 100A has its root 100B (bottom end) electrically connected to the drain region 16 of the transfer transistor of the DRAM cell, and the top trunk-like polysilicon layer 126 extends upwardly from the top of the bottom trunk-like polysilicon layer 100A. The two branch-like polysilicon layers (116A and 116B) and 120 each branch out sideways, that is, horizontally and substantially perpendicularly to the top trunk-like polysilicon layer 126. The branch-like polysilicon layer 120A has two horizontal flat segments 120A1 and 120A2 extending horizontally to either side, and the branch-like polysilicon layer 116 has two L-shaped portions (116A, 116B), each of which includes a first segment (respectively 116A1 and 116B1) extending horizontally from either side and a second segment (respectively 116A2 and 116B2) extending downwardly therefrom.

From the foregoing descriptions of the preferred embodiments of the invention, it will be apparent to those skilled in the art of semiconductor technology that the various structures for the trunk-like and branch-like elements can be utilized either individually or in various combinations and various numbers, to form a tree-type capacitor. Such arrangements are to be considered within the scope of the invention.

In addition, although in the foregoing description of the preferred embodiments, the drain of the transfer transistor is based on a diffused, region in a silicon substrate, the invention is not limited to such a semiconductor structure. Other structures for the drain region, such as a trench-type drain region, may also be used and are within the scope of the invention.

Further, all the elements in the accompanying drawings are drawn schematically for demonstrative purposes only and therefore not to the actual scale. Such illustrated dimensions therefore should by no means be considered limitations to the scope of the invention.

The invention has been described using exemplary preferred embodiments. However, it is to be understood that the scope of the, invention is not limited to the disclosed embodiments. To the contrary, it is intended to cover various modifications and similar arrangements. The scope of the claims, therefore, should be accorded the broadest interpretation so as to encompass all such modifications and similar arrangements.

What is claimed is:

1. A semiconductor memory device, comprising:
   (a) a substrate;
   (b) a transfer transistor formed on said substrate, said transfer transistor having a drain region; and
   (c) a tree-type capacitor electrically connected to said drain region, said tree-type capacitor including:
      (i) a conductive layer having a trunk and a top portion, said trunk having a bottom end and a top end, said bottom end being electrically coupled to said drain region, said top end being directly connected to said top portion, said trunk extending substantially upright from said bottom end, said top portion extending substantially perpendicular to said trunk in opposite directions so that said trunk and said top portion collectively form an upright T-shape;
      (ii) at least a first branch-shaped conductive layer substantially L-shaped in cross section, said at least a first branch-shaped conductive layer being free of contact with said top portion, and having a first segment with a first end electrically and directly connected to a surface of said trunk, said first segment extending perpendicularly from said trunk, said first branch-shaped conductive layer having a second segment extending perpendicularly away from a second end of said first segment opposite said first end in a direction towards said substrate, said T-shaped conductive layer and said at least a first branch-shaped conductive layer in combination comprising a storage electrode for said tree-type capacitor;
      (iii) a dielectric layer formed over surfaces of both said T-shaped conductive layer and said at least a first branch-shaped conductive layer; and
      (iv) an overlaying conductive layer overlaying said dielectric layer, said overlaying conductive layer serving as an opposed electrode of said tree-type capacitor.

2. The semiconductor memory device of claim 1 wherein said tree type capacitor further comprises:
   a top trunk-shaped conductive layer extending substantially upright from a top end of said upright T-shaped conductive layer.

3. The semiconductor memory device of claim 2, wherein said top trunk-shaped conductive layer is substantially T-shaped in cross section.

4. The semiconductor memory device of claim 2, wherein said top trunk-shaped conductive layer is substantially solid, pillar-shaped, and free of any insulator therein.

5. The semiconductor memory device of claim 2, further comprising at least a second branch-shaped conductive layer, said at least a second branch-shaped conductive layer having one end directly connected to a surface of an upward extended portion of said top trunk-shaped conductive layer.

6. The semiconductor memory device of claim 1, wherein said at least a first branch-shaped conductive layer includes two substantially parallel first branch-shaped conductive layers, each having respective first and second segments thereby being substantially L-shaped in cross section and having one end directly connected to said surface of of said trunk.

7. The semiconductor memory device of claim 1, wherein said tree-type capacitor further includes a second branch-shaped conductive layer having a flat segment branching out horizontally from said surface of said trunk; and wherein said dielectric layer is formed over surfaces of said T-shaped conductive layer, said at least a first branch-shaped conductive layer and said second branch-shaped conductive layer.

8. The semiconductor memory device of claim 7, wherein said tree type capacitor further comprises:
   a top trunk-shaped conductive layer extending substantially upright from a top end of said upright T-shaped conductive layer.

9. The semiconductor memory device of claim 8, wherein said top trunk-shaped conductive layer is substantially T-shaped in cross section.

10. The semiconductor memory device of claim 8, wherein said top trunk-shaped conductive layer is solid, substantially pillar-shaped, and free of any insulator therein.

11. The semiconductor memory device of claim 8, wherein said second branch-shaped conductive layer branches out from an upwardly extending surface of said top trunk-shaped conductive layer.

12. The semiconductor memory device of claim 7, wherein said at least a first branch-shaped conductive layer includes two substantially parallel branch-shaped conductive layers, each having respective first and second segments thereby being substantially L-shaped in cross section and having one end directly connected to said surface of said trunk.

13. A semiconductor memory device having a tree-type capacitor, comprising:
   (a) a substrate having an upper surface;
   (b) a transfer transistor formed on said substrate, said transfer transistor having a drain region; and (c) a tree-type capacitor electrically connected to said drain region, said tree-type capacitor including:
  (i) a conductive layer having a trunk and a top portion, said trunk having a bottom end and a top end, said bottom end being electrically coupled to an upper surface of said drain region, said top end being directly connected to top portion, said trunk extending from said bottom end in a direction away from said upper surface of said drain region, said top portion extending perpendicular to said trunk in opposite directions, so that said trunk and said top portion collectively form an upright T-shape;
  (ii) at least a first branch-shaped conductive layer that is free of contact with said top portion and having a first segment and a second segment, said first segment having a first end and a second end, the first end of said first segment being directly connected to a surface of said trunk and extended substantially perpendicular to said surface of said trunk, and said second segment having one end directly connected to the second end of said first segment and extending perpendicularly away therefrom toward an upper surface of said drain region, said T-shaped conductive layer and said at least a first branch-shaped conductive layer in combination comprising a storage electrode for said tree-type capacitor;
  (iii) a dielectric layer formed over surfaces of both said T-shaped conductive layer and said at least a first branch-shaped conductive layer; and
  (iv) an overlaying conductive layer overlaying said dielectric layer, said overlaying conductive layer serving as an opposed electrode of said tree-type capacitor.

14. The semiconductor memory device of claim 13, wherein said tree type capacitor further comprises:
  a top trunk-shaped conductive layer extending substantially upright from a top end of said upright T-shaped conductive layer.

15. The semiconductor memory device of claim 14, wherein said top trunk-shaped conductive layer is substantially T-shaped in cross section.

16. The semiconductor memory device of claim 14, wherein said top trunk-shaped conductive layer is solid, substantially pillar-shaped, and free of any insulator therein.

17. The semiconductor memory device of claim 13, wherein said at least a first branch-shaped conductive layer includes two oppositely disposed first branch-shaped conductive layers, at least one of the two having:

a first segment having a first end connected to a surface of said portion of said T-shaped conductive layer and a second end; and
  a second segment extending perpendicularly from said second end of the first segment.

18. The semiconductor memory device of claim 17, wherein each respective second segment extends perpendicularly from the second end of the respective first segment on one side of said T-shaped conductive layer.

19. The semiconductor memory device of claim 13, wherein said at least a first branch-shaped conductive layer includes two substantially parallel branch-shaped conductive layers, each having a first segment and a second segment, each first segment having one end connected to a surface of said trunk.

20. The semiconductor memory device of claim 13, wherein said tree-type capacitor further includes:
  a second branch-shaped conductive layer having a flat segment branching outward from a surface of said trunk in a direction perpendicular to said trunk;
  and wherein said dielectric layer is formed over surfaces of said T-shaped conductive layer and said first and second branch-shaped conductive layers.

21. The semiconductor memory device of claim 20, wherein said tree type capacitor further comprises:
  a top trunk-shaped layer conductive extending substantially upright from a top end of said upright T-shaped conductive layer.

22. The semiconductor memory device of claim 21, wherein said top trunk-shaped conductive layer is substantially T-shaped in cross section.

23. The semiconductor memory device of claim 21, wherein said top trunk-shaped conductive layer is substantially solid, pillar-shaped, and free of any insulator therein.

24. The semiconductor memory device of claim 21, wherein said second branch-shaped conductive layer has one end connected to an upward extending surface of said top trunk-shaped conductive layer.

25. The semiconductor memory device of claim 20, wherein said at least a first branch-shaped conductive layer includes two substantially parallel branch-shaped conductive layers, each having one end connected to said surface of said trunk.

* * * * *